United States Patent [19]
Crotti

[11] Patent Number: 5,210,046
[45] Date of Patent: May 11, 1993

[54] METHOD OF FABRICATING EPROM DEVICE WITH METALLIC SOURCE CONNECTIONS

[75] Inventor: Pier L. Crotti, Landriano, Italy

[73] Assignee: SCS-Thomas Microelectronics S.r.l., Agrate Brianza, Italy

[21] Appl. No.: 632,101

[22] Filed: Dec. 20, 1990

[30] Foreign Application Priority Data

Dec. 22, 1989 [IT] Italy .................. 83651 A/89

[51] Int. Cl.⁵ .................. H01L 21/70; H01L 21/265
[52] U.S. Cl. .................. 437/43; 437/48; 437/52; 437/195; 437/228
[58] Field of Search .......... 437/43, 48, 52, 195, 437/228, 187; 156/643; 357/23.5, 23.6; 365/185

[56] References Cited

U.S. PATENT DOCUMENTS

| | | | |
|---|---|---|---|
| 4,849,369 | 7/1989 | Jeuch et al. | 437/43 |
| 5,081,056 | 1/1992 | Mazzali et al. | 437/43 |
| 5,134,083 | 7/1992 | Matthews | 437/228 |

FOREIGN PATENT DOCUMENTS 2572836 11/1984 France .
61-30063 6/1986 Japan .

Primary Examiner—Olik Chaudhuri
Assistant Examiner—Loc Q. Trinh
Attorney, Agent, or Firm—Kenneth C. Hill

[57] ABSTRACT

An integrated EPROM device which can be manufactured using standard high definition photolithographic techniques with unit cells of markedly reduced dimensions as compared to the minimum dimensions that can be achieved with the prior art, has field isolation structures between adjacent cells along rows of the array in the form of continuous isolation strips which extend for the whole column length of the array, thus avoiding the problems associated with photolithographic defining rectangular geometries. The electrical interconnection between the sources of the cells of each row is achieved by a special metal source "line", formed between two adjacent gate lines, using for the purpose a conformally deposited metal layer from which both the drain contacts and these source interconnection metal "lines" are created in a self-alignment way.

1 Claim, 3 Drawing Sheets

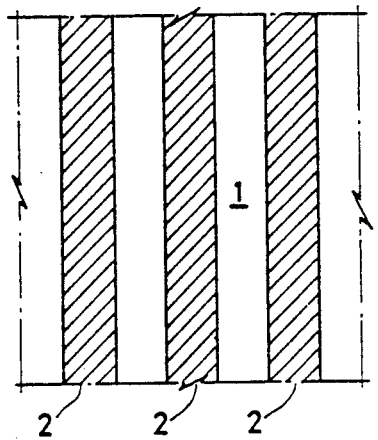
FIG.1
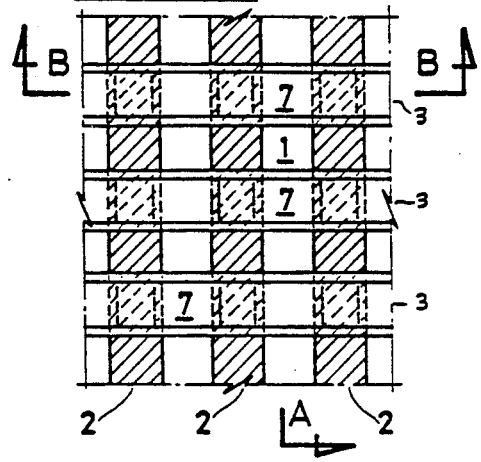
FIG.2
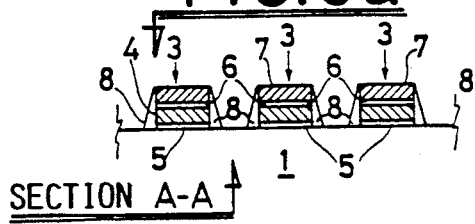
FIG.3a SECTION A-A
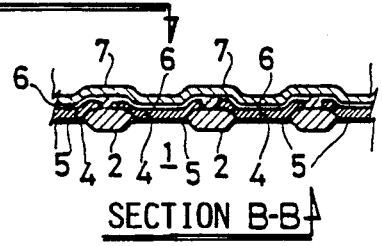
FIG.3b SECTION B-B
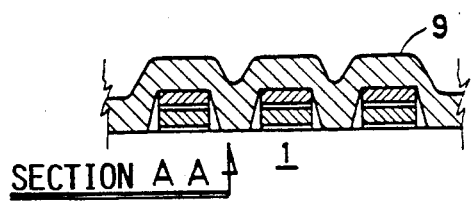
FIG.4 SECTION A-A
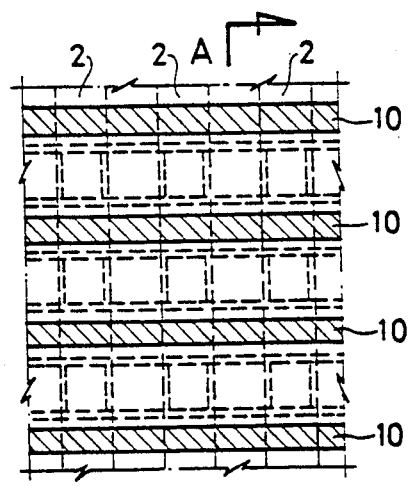
FIG.5
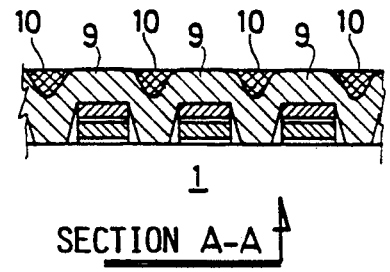
FIG.6 SECTION A-A

SECTION A-A

METHOD OF FABRICATING EPROM DEVICE WITH METALLIC SOURCE CONNECTIONS

BACKGROUND OF THE INVENTION

1. Field of the Invention

The present invention concerns an EPROM-type integrated device with metallic source connections and a process for the manufacture of EPROM cells of markedly reduced dimensions as compared to the minimum dimensions that can be obtained with conventional photolithographic definition techniques, by employing metallic source connections.

2. Description of the Prior Art

EPROM devices or memories are well known and widely used in modern digital technologies. These integrated semiconductor devices are characterized in that they have one or more arrays of EPROM memory unit cells, individually addressed and organized in rows and columns, each of which essentially comprises a floating-gate (or double-gate) MOS transistor. The conventional architecture of these arrays of EPROM cells is also known, characterized by the presence of interconnection lines of drain contacts, belonging to transistors (cells) of the same column, perpendicular to gate lines. The sources of two cells (floating-gate MOS transistors) which are adjacent to each other in the direction of column alignment of the cells are electrically connected in common and, in a conventional array architecture, cells belonging to the same row have their sources electrically connected in common. In these devices the field isolation structures which separate the drains and gates of pairs of transistors arranged in the same row have an essentially rectangular geometry (see FIG. 10), whether they are embedded (e.g. of the BOX type) or formed by thermally growing a thick layer of field oxide. Usually drain contacts are formed by purposely masking and etching a dielectric layer uniformly deposited on the surface of the semiconductor wafer to insulate the transistor gate lines or structures.

As regards the possibility of photolithographic definition of ever smaller features, the above mentioned topographic aspects of the "traditional" architecture of these devices present the following problems.

Insulation Mask (or Active Areas Mask)

The geometries, even if perfectly rectangular on the mask, become chamfered on their reproduction on the wafer. This depends essentially on limits of an optical nature (diffraction) of the image transfer systems: the aerial image on the wafer of the figures projected by the mask is already rounded at the corners, a rounding which further increases in the subsequent development process.

With high-resolution optical equipment (e.g. with a N.A.>0.45) and with a high-contrast masking process, the phenomenon may be limited but still exists. Currently the best typical value that can be obtained is a chamfer with a radius of curvature of about a quarter of a micrometer. This value increases in the case of thermally grown field oxide.

Rounding of the corners of rectangular geometries leads to a critical state of alignment of the gate lines above and a certain dimensional variability of the channel width of the devices.

Contacts Mask

The photolithographic problems are the known ones of alignment in relation to the layers already formed and rounding (even more pronounced here) of the corners of the geometries with a consequent reduction of the actual drain contact area.

OBJECTIVE AND SUMMARY OF THE INVENTION

There is thus a need for EPROM devices with cells of smaller dimensions and which may be manufactured using standard photolithographic techniques, although using high-resolution optics and a high-contrast masking process. This objective is essentially achieved by the EPROM integrated device with metallic source connections according to the present invention which may be created by a special manufacturing process, also according to the present invention. Essentially the process according to the invention overcomes the problems connected with the definition of rectangular geometries by instead defining and using essentially continuous isolation areas, in the form of field isolation strips, and by employing metallic source interconnection lines for the transistors or cells of the same row, advantageously formed in an essentially self-aligned way in relation to the sides of the adjacent gate lines, as are the drain contacts themselves.

The process according to the invention enables a marked reduction in the area occupied by each unit cell without introducing elements of critical state in the photolithographic definition of the geometrical features but rather eliminating or essentially reducing every existing aspect of critical state elements.

BRIEF DESCRIPTION OF THE DRAWINGS

The various aspects and advantages of the integrated device and manufacturing process according to the invention will become clear from the following description of a form of embodiment, referring also to the attached drawings in which.

The set of FIGS. 1, 2, 3a, 3b and 4 to 9 represents the same number of plan or cross-sectional schematic views of a device according to the invention which, apart from illustrating the characteristic aspects of the original architecture of the device, shows the salient stages of the manufacturing process.

DESCRIPTION OF THE PREFERRED EMBODIMENT

Figure 7:
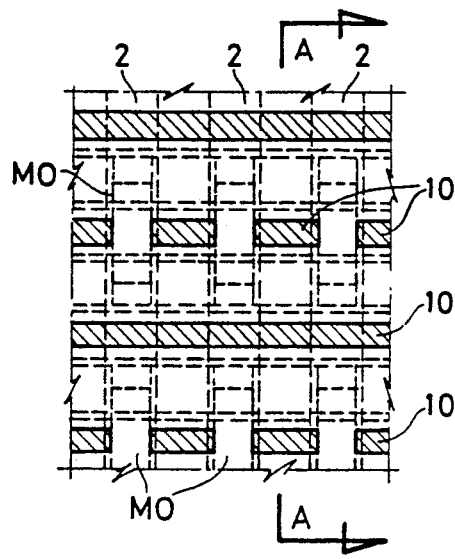
Figure 8:
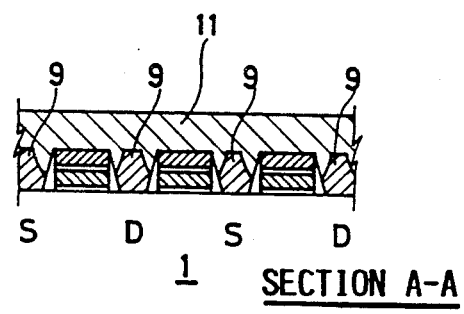

The manufacturing process according to the invention is illustrated in FIGS. 1-9.

On a semiconductor substrate 1, the field isolation structures 2 are first defined and formed, in the form of continuous isolation strips, parallel to each other, which extend along the entire length of the array of EPROM cells. The isolation structures 2 may comprise a layer of thermal oxide grown on the unmasked surface of the semiconductor substrate 1, according to one of the well-known silicon nitride masking techniques, such as the LOCOS (Philips) or Planox (SGS-THOMSON) and similar techniques or may be embedded isolation structures, made by cutting trenches in the semiconductor substrate surface which, after having performed the isolation implantation, are filled by depositing a dielectric material such as silicon oxide (BOX isolations), advantageously re-establishing a perfect flatness of the wafer surface.

As it may be observed, the photolithographic definition of the isolation structures 2 is essentially free of problems of rounding of the corners of rectangular geometries in the image transfer stage, as in the known manufacturing processes of these devices. This is because the photolithographic definition of parallel strips is optically relatively easy since diffraction problems of only one order need to be dealt with.

After having created the isolation structures 2 using one of the known techniques, and still making use of techniques which are well-known to the expert of the field, gate structures are created, referenced as a whole by 3. As it may be observed in FIGS. 2 and 3, the gate structures for the array of EPROM cells are parallel lines, spaced apart, which intersect at right angles (superimposed over them) the isolation strips 2 previously formed on the front of the semiconductor wafer. As shown in the two orthogonal cross-sections A—A and B—B of FIGS. 3A and 3B respectively, each gate structure comprises a first conductor layer 4, usually of polycrystalline silicon (Poly I), electrically insulated from semiconductor 1 by a layer of gate oxide 5 previously formed on the active areas, between the isolation strips 2, which constitutes the floating gate of the unit cells of the device completely insulated electrically by a dielectric layer or multilayer 6 over which a second conductor layer of polycrysstalline silicon (Poly II) 7 is deposited and defined which constitutes the control gate (common for all the side-by-side cells of the same row of the array. The side walls of the gate structures 3 are covered with a tapered layer of dielectric oxide 8 for forming as many spacers for the subsequent stages of implantation of the drain and source junctions as for forming self-aligned contacts over the same areas, as described below.

Briefly, after the field isolation strip structures 2 have been formed, the manufacturing process which is followed to form tha above described gate structures, involves the following steps:

a) thermal gate oxidation to form the gate oxide layer 5 on the active areas of the semiconductor substrate;

b) chemical vapor deposition of a layer of polycrystal line silicon (Poly I) and subsequent doping thereof;

c) formation of the Poly I mask to define (usually along a first direction) the floating gates 4 by etching the polysilicon;

d) isolation by oxidizing the surface of the polysilicon or by depositing a dielectric insulation layer or multilayer 6 of the partially defined floating gate 4 formed by the Poly I;

e) chemical vapor deposition of a second polysilicon layer (Poly II) and if required of a silicide layer to form the control gate lines 7;

f) masking and etching the Poly II layer to define parallel lines of control gates 7;

g) masking and etching the Poly I layer to completely define the floating gates along an orthogonal (second) direction, masking and implanting sources and drains, reoxidizing, implanting LDD, masking and enrichment implanting source and drain junctions and forming dielectric spacers 8 along the sides of the gate structures.

The above described sequence of operations for the formation of the gate structures, as schematically shown in FIGS. 2, 3A and 3B, represents a relatively standard sequence although it may also be modified in a nonessential way, and a more detailed description of the individual operations seems superfluous. Considering the variations, as compared to the standard processing sequence, which occur later on, it is advisable however to readjust the conditions of implanting drains and sources and it may be also advantageous to carry out, during these manufacturing stages thermal annealing treatments which according to a standard process flowsheet would indeed be performed at the same time as the so-called "reflow" of opened contacts.

The structure obtained at the end of this first series of steps is schematically shown in FIGS. 2, 3A and 3B.

At this point the process according to the invention comprises the following steps:

1. depositing, in a conformal way, a matrix layer or several superimposed layer of metallic material (metal). Upon completion of the deposition, a cross sectional view along the section line A—A of FIG. 2 is shown in FIG. 4.

2. Depositing a layer of planarization material, such as a SOG (Spun-On-Glass).

3. Maskless blanket etching for planarizing the layer of planarization material until the peaks of the matrix metal layer 9 below, previously deposited in a conformal manner, are exposed.

On completing these last two operations the front of the wafer being fabricated will take on the appearance schematically illustrated in FIGS. 5 and 6 which represent a plan view and sectional view along the section plane A—A of FIG. 5 (or of FIG. 2) respectively. As it may be observed, residues of the planarization material remain in the hollows of the underlaying conformally deposited metal layer 9, in the form of strips 10.

4. Forming a DRAIN SEPARATION mask. This is an additional mask (not present in a standard manufacturing sequence) used specifically in the process of the invention. The openings of this mask are shown in the plan view of FIG. 7 and indicated by the letters MO. This mask is not critical and serves solely to "interrupt" by etching the strips of residual planarization material 10 running over the drain areas of the cells of a row of the array arrangement of the cells at the intersection points with the isolation strips 2, as shown in the plan view of FIG. 7.

After this step the residual strips of planarization material 10 running over the source regions or source areas of the various cells of a row remain integral whereas the strips of residual planarization material 10 running over the drain regions or drain areas of the cells of the same row are interrupted so as to leave residues 10 only directly above the drain area within the active areas delimited by the parallel field isolation strips orthogonally oriented in relation to the strips of residual planarization material.

5. Using the residues of planarization material 10, in the form of a continuous strip running over the source areas of the cells of each row and in the form of sections over the distinct drain areas, the metal layer 9, conformally deposited, is etched in an essentially isotropic way, until the etching front edge along the sides of spacers 8, present on the adjacent sides of the gate structures is lowered sufficiently to cause pillar shaped metal residues of the matrix layer 9 to remain in the drain areas as well as in the form of a continuous metal line running over the source areas of the transistors of each row. This result is shown in the schematic cross-section of FIG. 8. As it can be seen, the pillar shaped, or of a similar cross-section, residues 9 of the conformally deposited matrix metal layer create as many self-aligned discrete drain contacts and continuous seam-like common source metal contact lines and interconnections.

6. Removing the residual masking planarization material 10 remaining over the contact metal residues 9.

7. Chemical vapor deposition of a layer of dielectric insulation material 11, as shown in the cross-section in FIG. 8. The surface of the wafer is markedly flatter than it is in a standard process thus facilitating subsequent defining steps. If required, the surface may also be further planarized.

8. Forming a second additional mask (not used in a standard manufacturing process) which may be called TOP PILLAR and which is used to "uncover" the peaks of the pillar shaped drain contact metal residues 9. Clearly, this mask is also not critical, neither as regards dimensions, nor alignment.

9. Depositing a drain interconnection metal layer 12 to connect electrically the pillar shaped drain contacts.

10. Forming a mask to define drain interconnection lines 12.

Figure 9:
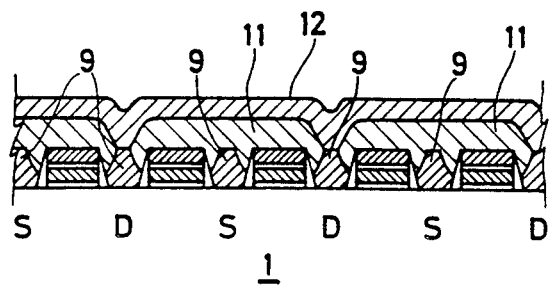

The last three operations produce the result shown in the cross-section of FIG. 9.

Figure 10:
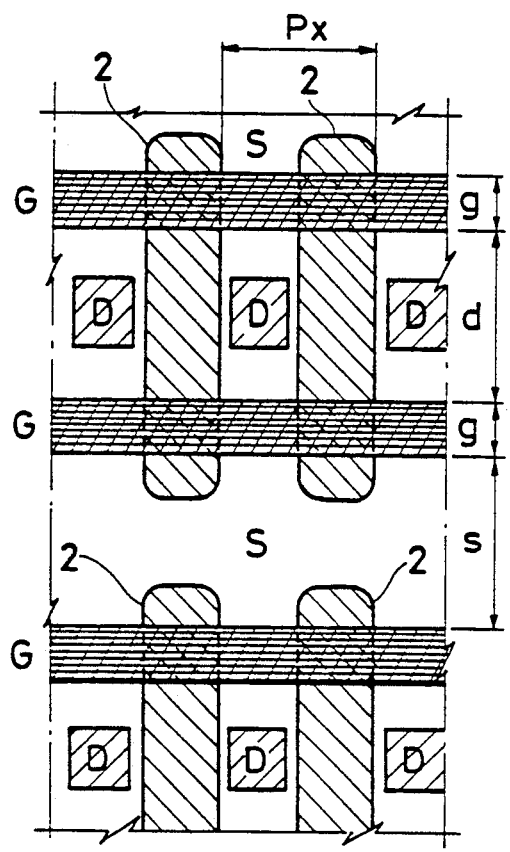
FIG. 10 is a schematic plan view of an EPROM integrated device according to the prior art.

As a comparison, FIG. 10 shows a schematic plan view of an integrated EPROM device made according to the prior art, characterized by the presence of field isolation structures 2 between pairs of side by side cells in rows of the array of EPROM cells, such isolation structures having a characteristic rectangular geometry, being interrupted in the source interconnections areas. The letters S (source), G (gate) and D (drain) are written in the plan view directly over the respective areas of the integrated device. The pitch Px between the cells and the respective gate lengths (g), the gate-to-gate distance over a drain (d) and the gate-to-gate distance over a source (s) are also shown.

Figure 11:
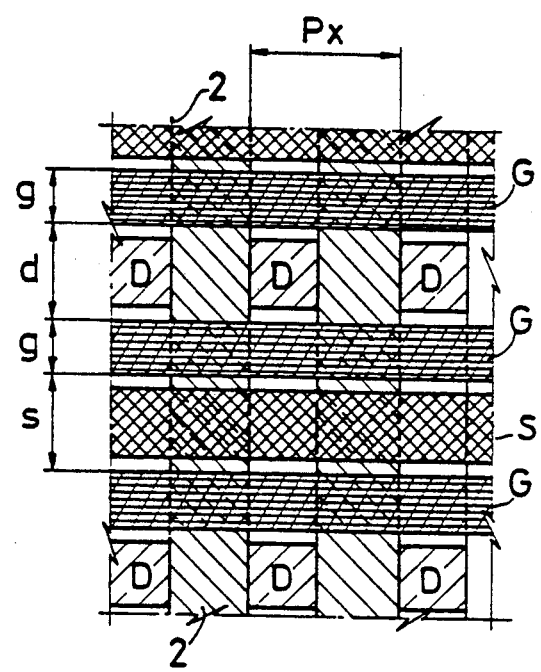
FIG. 11 represents a schematic plan view of an EPROM integrated device, equivalent to the known device shown in FIG. 10, but made according to the present invention.

An integrated EPROM device made according to the present invention and with characteristics comparable to those of the device of the prior art shown in FIG. 10, i.e. with the same pitch Px and the same gate length g, is schematically illustrated in the plan view in FIG. 11. In this case too the respective letters written in the plan Figure identify the relative gate (G), drain (D) and source (S) areas and for the purpose of comparison the relative dimensions are also shown in a similar way as in FIG. 10.

The greater compactness of the device according to the invention, as depicted in FIG. 11, as compared to a comparable device according to the prior art, shown in FIG. 10, may be immediately appreciated by observing the two Figures. For the same pitch Px and gate length, the cell area is markedly reduced in the case of the device according to the present invention as compared to the cell area of a device manufactured according to the prior art.

A quantification of the reduction in the area occupied by each individual EPROM cell that can be made according to the present invention is set out in Table I below; the latter shows the respective dimensions in micrometers, for a device made according to the prior art and for a device made according to the present invention, in the case of integrated devices manufactured on two different integration scales: one for a 4 Mbit device and another for a 16 Mbit device.

TABLE I

|  |  | 4 Mbit | | 16 Mbit | |
|---|---|---|---|---|---|
|  |  | Prior Art | Invention | Prior Art | Invention |
| PITCH | Px | 3 | 3 | 2.1 | 2.1 |
| GATE LINE WIDTH | g | .8 | .8 | .5 | .5 |
| GATE-TO-GATE DIST. OVER DRAIN | d | 2.6 | 1.6 | 2.2 | 1 |
| GATE-TO-GATE DIST. OVER SOURCE | s | 1.8 | 1.6 | 2.1 | 1 |
| CELL AREA ($\mu m$)$^2$ |  | 9 | 7.2 | 4.41 | 3.15 |

By eliminating the need to define critical rectangular geometries and by creating metallic source interconnections in a self-aligned way, the gate-to-gate distance over a drain and the gate-to-gate distance over a source can be considerably reduced, thus reducing the cell area, for the same pitch and the same gate length of cells.

What I claim:

1. Process for the fabrication of an integrated EPROM device comprising an array of unitary memory cells, each having a gate structure between a source area or source region and a drain area or drain region of a semiconductor substrate, arranged in pairs in rows and columns, the control gates of the cells of the same row being electrically connected together by a respective continuous gate line, the drain area of the cells being individually contacted through drain contacts and the drain contacts of cells belonging to the same column being electrically connected together by a respective drain line, the source regions of adjacent cells of the same column and belonging to pairs of cells of two distinct adjacent rows of the array being electrically connected in common, a field isolation structure separating the drain areas and gate structures of one cell from those of an adjacent cell positioned on the same row, characterized in that it comprises the following steps:

forming field isolation structures between cells of the same row of the array in the form of continuous isolation strips, spaced apart and parallel, which extend uninterrupted along the whole column length of said array of cells;

forming gate structures in the form of gate lines, spaced apart and parallel, running perpendicularly in relation to the isolation strips below and having dielectric spacers formed along side walls, conformally depositing a matrix metal layer;

depositing a layer of planarization material;

blanket maskless etching the layer of planarization material until the peaks of the metal layer below previously deposited in a comformal manner are exposed while leaving residual strips of said planarization material within hollows of said metal layer;

forming a photoresist drain separation mask having openings in the areas where the strips of residual planarization material running over the drain areas of cells belonging to each row of said array cross over the isolation strips;

removing by etching the residual planarization material of said strips through said openings of the mask and removing the latter;

etching, under essentially isotropic conditions, said metal layer using said residues of planarization material as a mask, leaving pillar shaped contact metal residues of said metal layer, self-aligned in relation to adjacent gate structures, over drain areas of all the unitary cells and a seam-like metal residue, having a pillar shaped cross-section, in the form of a continuous line, self-aligned in relation to adjacent gate structures, running over the source areas of all the cells belonging to the each row of said array;

removing said residues of planarization material used as a mask during the previous etching step;

depositing an insulation layer of dielectric material;

forming a photoresist mask and etching the said isolation layer of dielectric material through said mask, to expose the peaks of said pillar shaped contact metal residues formed over the drain area of the cells and removing said mask;

depositing a second metallic layer to interconnect said pillar shaped, drain contact metal residues;

forming a mask to define interconnection drain lines respectively for the cells belonging to each column of said array and removing said mask.

* * * * *